United States Patent [19]

Yamazaki

[11] Patent Number: 4,719,122
[45] Date of Patent: Jan. 12, 1988

[54] CVD METHOD AND APPARATUS FOR FORMING A FILM

[75] Inventor: Shunpei Yamazaki, Tokyo, Japan

[73] Assignee: Semiconductor Energy Laboratory Co., Ltd., Japan

[21] Appl. No.: 849,291

[22] Filed: Apr. 8, 1986

[30] Foreign Application Priority Data

Apr. 8, 1985 [JP] Japan ............................. 60-75048
Apr. 8, 1985 [JP] Japan ............................. 60-75049
May 7, 1985 [JP] Japan ............................. 60-96386

[51] Int. Cl.$^4$ ............................. B05D 3/06
[52] U.S. Cl. ............................. 427/53.1; 118/50.1
[58] Field of Search ............................. 427/53.1, 54.1, 86; 204/157.3, 157.4, 157.41, 157.45; 118/50.1, 620, 715

[56] References Cited

U.S. PATENT DOCUMENTS

| | | | |
|---|---|---|---|
| 4,260,649 | 4/1981 | Denison et al. | 427/53.1 |
| 4,435,445 | 3/1984 | Allred et al. | 427/54.1 |
| 4,568,565 | 2/1986 | Gupta et al. | 427/53.1 |
| 4,581,248 | 4/1986 | Roche | 427/53.1 |
| 4,581,249 | 4/1986 | Kamiya | 427/53.1 |

*Primary Examiner*—John H. Newsome
*Attorney, Agent, or Firm*—Gerald J. Ferguson, Jr.; Michael P. Hoffman; Michael J. Foycik, Jr.

[57] ABSTRACT

A CDV method in which a substrate having a surface to be deposited where the film is placed in a reaction chamber and a reactive gas introduced into the reaction chamber is excited by irradiation with flat light and scattered light to thereby deposit the film on the substate surface. The flat light is directed along the substrate surface in close proximity thereto, and the scattered light is directed to the substrate surface thereto.

11 Claims, 2 Drawing Figures

CVD METHOD AND APPARATUS FOR FORMING A FILM

BACKGROUND OF THE INVENTION

1. Field of the Invention

The present invention relates to a CVD method and apparatus for depositing a film on a substrate through a CVD epitaxial growth process.

2. Description of the Prior Art

Heretofore there has been proposed a CVD method according to which a substrate having a surface to be deposited with a film is placed in a reaction chamber and a reactive gas being introduced thereinto is excited by irradiation with light, thereby depositing a film on the substrate surface. In this case, the light for exciting the reactive gas is usually scattered light.

With such a prior art CVD method, since the light used has only a relatively low energy density, the reactive gas cannot efficiently be excited. This inevitably leads to the defects of a relatively low film deposition rate and an appreciably low utilization efficiency of light.

SUMMARY OF THE INVENTION

It is therefore an object of the present invention to provide a novel CVD method and apparatus therefor which are free from the abovesaid defects of the prior art.

According to the CVD method of the present invention, flat light is employed for exciting the reactive gas. In this instance, the flat light may preferably be laser light which has a wavelength at which it resonates with the reactive gas. Furthermore, it is preferable that the flat light be emitted along the substrate surface to be deposited with a film, at a distance 10 times or less the mean free path of the excited reactive gas, that the film be deposited on the substrate surface held downward, and that the substrate be heated from behind during the film deposition.

Since the flat light has a larger energy density than does the scattered light employed in the prior art, the reactive gas can be excited more efficiently than in the conventional CVD method, permitting the film deposition at a higher rate than is obtainable with the conventional CVD method.

Moreover, according to the CVD method of the present invention, the reactive gas is excited through the combined use of the flat light and the scattered light, by which the film can be deposited over the entire area of the substrate surface at a high rate regardless of whether the substrate surface is uneven or not.

Moreover, according to the CVD apparatus of the present invention, a light exciting means has a first light irradiating means which comprises a light source and an optical means which flattens the light therefrom and directs the flat light to the reactive gas in a manner to extend along and in close proximity to the substrate surface to be deposited with a film. In this instance, the light source may preferably produce laser light of a wavelength at which it resonates with the reactive gas. It is preferable that the optical means aim the flat light at the reactive gas so that it travels in close proximity and inparallel to the substrate surface at a distance 10 times or less the mean free path of the excited reactive gas. Furthermore, it is preferable that a substrate holding means hold the substrate so that its surface to be deposited with a film is downward. Moreover, it is preferable that a means be provided for heating the substrate from the side opposite from its surface which is to be deposited with a film and is held downward by the substrate holding means. Besides, it is preferable that the optical means of the first light irradiating means be disposed in a first light irradiation chamber which is linked with the reaction chamber through a first partition means which has a first light-transparent window permitting the passage therethrough of the flat light and first slits and that an unreactive gas be passed from the first light irradiation chamber towards the reaction chamber through the first slits of the first partition means.

With such a CVD apparatus of the present invention, a film can efficiently be formed through the CVD method of the present invention described above.

Furthermore, the light exciting means of the CVD apparatus of the present invention has a second light irradiating means which aims scattered light at the reactive gas in a direction perpendicular to the substrate surface to be deposited with a film. In this instance, it is preferable that the second light irradiating means be disposed in a second light irradiation chamber which is linked with the reaction chamber through a second partition means which has a second light-transparent window permitting the passage therethrough of the scattered light and second slits and that an unreactive gas be passed from the second light irradiation chamber toward the reaction chamber through the second slits of the second partition means.

Also with such a CVD apparatus of the present invention, a film can efficiently be deposited over the entire area of the substrate surface by the CVD method of the present invention, even if the substrate surface is uneven.

Other objects, features and advantages of the present invention will become more fully apparent from the following detailed description taken in conjunction with the accompanying drawings.

DESCRIPTION OF THE PREFERRED EMBODIMENTS

Figure 1:
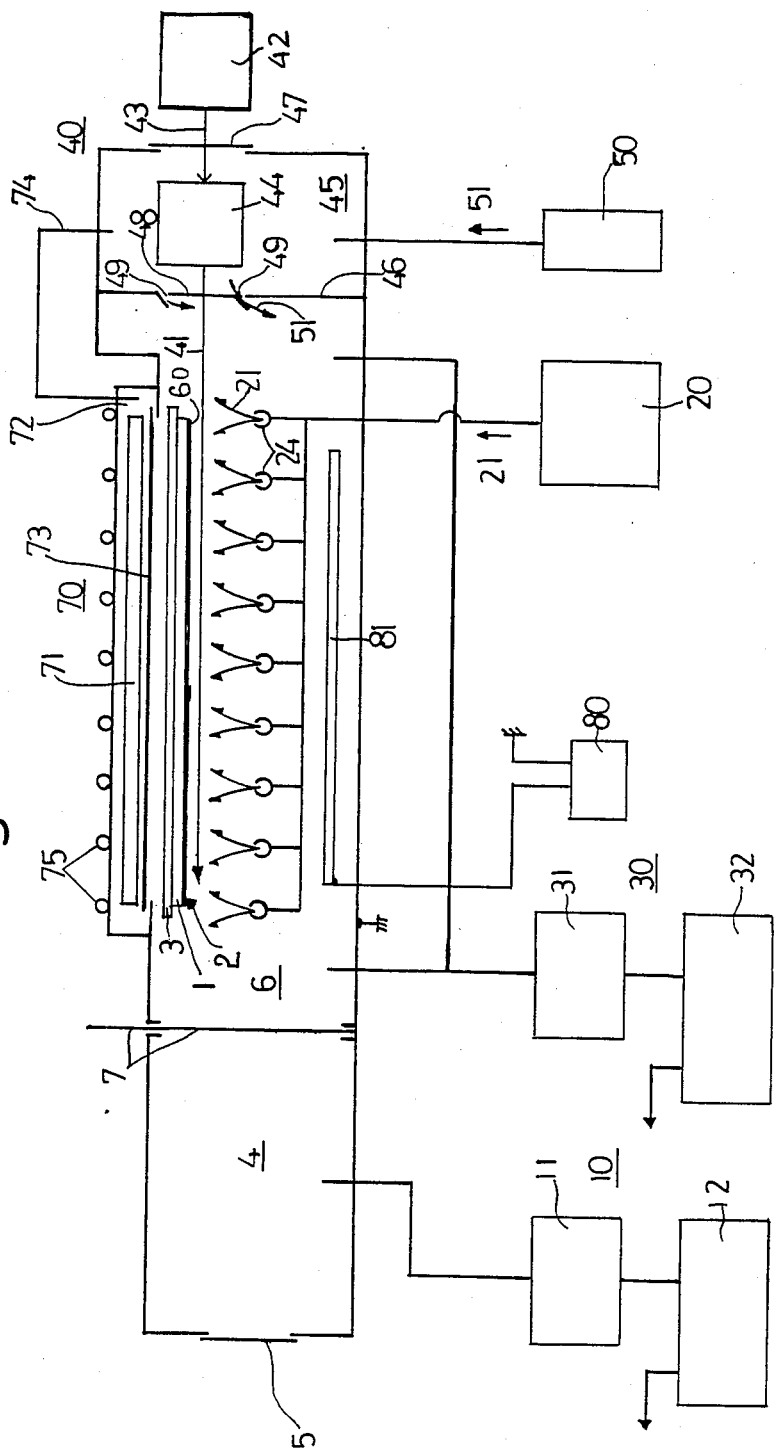
FIG. 1 is a diagram schematically illustrating an example of the film formation method by using an example of the film forming apparatus according to the present invention.

A description will be given first, with reference to FIG. 1, of an example of a film forming method by using an example of a film forming apparatus according to the present invention.

At first, a substrate 1, which is mounted horizontally on a substrate holder 3 in such a manner that its surface 2 to be formed with a film is held downward, is brought into a substrate introducing/removing chamber 4, temporarily opening its window 5.

Next, the substrate 1 mounted on the substrate holder 3, as mentioned above, is introduced into a reaction chamber 6, temporarily opening a shutter means 7. The reaction chamber 6 is linked with the substrate introducing/removing chamber 4 at one side thereof through the shutter means 7. In this instance, when the reaction chamber 6 is being evacuated, the shutter means 7 is opened after evacuating the substrate introducing/removing chamber 4 through use of an evacuating means 10 to hold it under the same pressure as in the reaction chamber 6. The evacuating means 10 comprises a turbo pump 11 and a rotary pump 12 interconnected in this order. The substrate 1 is placed horizontally in the reaction chamber 6 near its ceiling, with the surface 2 held downward.

Next, a reactive gas 21 from a reactive gas supply source 20 is introduced into the reaction chamber 6 toward the substrate 1 through a plurality of gas nozzle 24 which are disposed in the reaction chamber 6 centrally thereof in its vertical direction and opposite the substrate 1 at a relatively large distance. In this case, the reaction chamber 6 is evacuated from its bottom at both sides, by another evacuating means 30, to provide a predetermined pressure so that the reaction gas 21 is guided to pass over the substrate 1 and then downwardly thereof, thereafter being exhausted. The evacuating means 30 comprises a turbo pump 31 and a rotary pump 32 interconnected in this order, as is the case with the aforementioned evacuating means 10.

The reactive gas 21, which is being introduced into the reaction chamber 6, is excited by irradiation with light 41 from a light irradiating means 40.

The light irradiating means 40 is made up of a light source 42 and an optical means 44 by which the light 43 from the light source 42 is made flat and directed along the surface 2 of the substrate 1 to be formed with a film, as indicated. The light source 42 is an exeimer laser, for example, and its output light 43 has a wavelength at which it resonates with the reactive gas 21. The flat rays of light 41 for irradiating the reactive gas 21 to excite it is directed by the optical means 44 along the surface 2 of the substrate 1 at a distance 10 times or less the free path of the excited reactive gas. The optical means 44 is disposed in a light irradiation chamber 45 which is linked with the reaction chamber 6 through a partition means 46 on the side opposite from the substrate introducing/removing chamber 4. On the other hand, the light source 42 is disposed outside the light irradiation chamber 45, and its output light 43 is applied to the optical means 44 through a light-transparent window 47 of the light irradiation chamber 45.

The partition means 46 between the reaction chamber 6 and the light irradiation chamber 45 has a plurality of slits 49 through which they intercommunicate, and a light-transparent window 48 through which the flat rays of light 41 from the optical means 44 enter into the reaction chamber 6. An unreactive gas 51 such as hydrogen, helium, or argon is introduced into the light irradiation chamber 45 from an unreactive gas supply source 50. Since the light irradiation chamber 45 is exhaused by the evacuating means 30 through the slits 49 and the reaction chamber 6, the unreactive gas 51 introduced into the light irradiation chamber 45 flows on or along the surface of the light-transparent window 48 on the side of the reaction chamber 6.

Since the flat light 41 from the light irradiating means 40 is higher in energy density than light which has the same width as the light 41 but is not flat, the reactive gas 21 is almost excited efficiently by the flat light 41. Furthermore, the reactive gas 21 is excited in close proximity to the substrate surface 2, accordingly, the excited reactive gas efficiently make contact with the substrate surface 2 to be formed with a film.

On the other hand, the substrate 1 is heated by a heating means 70 to a predetermined temperature during the excitation of the reactive gas 21. The heating means 70 has a heater 71 which is formed by a halogen lamp, for instance, and by which the substrate 1 is heated on the side opposite from its surface 2. The heater 71 is disposed in a heater chamber 72 which is mounted on top of the reaction chamber 6 through a partition means 73 which permits the passage therethrough of heat rays. The heater chamber 72 communicates with the light irradiating chamber 45 via a pipe 74 and is held under the same pressure as in the light irradiation chamber 45. Moreover, the heater chamber 72 is cooled by a cooling means 75 disposed on its top panel so as to prevent its overheating.

Since the excited reactive gas makes contact with the surface 1 of the substrate 1 which is being heated by the heating means 70, a film 60 is deposited by epitaxial growth on the substrate surface 2. The reactive gas 21 which does not participate in the deposition of the film 60 is exhausted via the evacuating means 30. In this instance, since the excited reactive gas efficiently contacts the substrate surface 2, as mentioned above, the film 60 is rapidly formed. Furthermore, since the substrate surface 2 is held downward, unnecessary materials which are likely to be formed in the reaction chamber 6 are not essentially deposited on the substrate surface 2. This ensures the formation of the film without getting mixed thereinto such unnecessary materials and without pinholes which are liable to be made by the mixing of the unnecessary materials. Moreover, the optical means 40 for irradiating the reactive gas 21 by the flat rays of light 41 is placed in the light irradiation chamber 45 linked with the reaction chamber 6 through the partition means 46 and the partition means 46 has the slits 49 through which the reaction chamber 6 and the light irradiation chamber 45 intercommunicate. However, since the unreactive gas 51 flows from the light irradiation chamber 45 toward the reaction chamber 6 through the slits 49, the optical means 44 will not substantially be contaminated by the excited reactive gas or the reactive gas 21 before being excited. Besides, since the unreactive gas 51 passing through the slits 49 from the light irradiation chamber 45 toward the reaction chamber 6 flows in contact with or along the light-transparent window 48 of the partition means 46 on the side of the reaction chamber 6, the light-transparent window 48 will not essentially be contaminated, either. This ensures continuation of efficient excitation of the reactive gas 21 by the flat rays of light 41.

After the deposition of the film 60 to a required thickness on the substrate surface 2, heating of the substrate 1 by the heating means 70, cooling of the heater chamber 72 by the cooling means 75, and irradiation of the reactive gas 21 by the flat light 41 from the light irradiating means 40 are stopped, which is followed by stopping of the introduction of the reactive gas 21 into the reaction chamber 6 and the unreactive gas 51 into the light irradiation chamber 45.

Next, the substrate 1 mounted on the substrate holder 3 is moved from the reaction chamber 6 to the substrate introducing/removing chamber 4, temporarily opening the shutter means 7.

Next, the substrate introducing/removing chamber 4 is temporarily opened, from which the substrate 1 mounted on the substrate holder 3 is taken out, and then the substrate 1 having the film 60 deposited on its surface 2 is removed from the substrate holder 3.

After bringing the substrate 1 back to the substrate introducing/removing chamber 5, a high-frequency source 80 which is connected between an electrode 81 disposed in the reaction chamber 6 and the chamber 6 is activated to produce a plasma discharge, by which unnecessary materials liable to adhere to the inner wall of the reaction chamber 6 are removed through the mechanic of etching, and the unnecessary materials are discharged by the evacuating means 30 to the outside.

Thus, a series of steps for depositing the film 60 on the substrate 1 are terminated.

Next, a description will be given of specific examples of the film forming method employing the apparatus of the present invention described above.

EXAMPLE 1

A gas mixture of dichlorosilane as a material gas and hydrogen as a carrier gas was introduced, as the reactive gas 21, from the reactive gas supply source 20 into the reaction chamber 6, and hydrogen was introduced, as the unreactive gas 51, from the unreactive gas supply source 50 in to the light irradiation chamber 45 which was held at a pressure of 3.0 Torr and in which the substrate 1 was being heated by the heating means 70 at 850° C. The dichlorosilane and the hydrodgen were supplied at flow rates of 50 and 200 cc/min, respectively, and the unreactive hydrogen gas was supplied at flow rate 200 cc/min. On the other hand, an examiner laser using XeCl was utilized as the light source 42 of the light irradiation means 40, from which was obtained laser light having a wavelength of 308 nm which was resonant with the Si-Cl bond, as the light 43. The laser light 43 thus obtained was rendered by the optical means 44 into the flat light 41 1 mm thick. The gas mixture, as the reactive gas 21, was irradiated, for six minutes or so, by the flat laser light 41 which was controlled so that the center plan of the light thickwise thereof was spaced 1 mm apart from the substrate surface 2 on which a film was intended to be deposited. In this instance, a silicon film about 4500 A thick was formed, as the film 60, on the substrate surface 2 at a rate of 800 A/min. The silicon film thus obtained has as high a resistivity as 2100 Ωcm or so.

EXAMPLE 2

A silicon film was deposited 9500 A thick on the substrate surface 2 through a method which was identical with that used in Example 1 except that the substrate 1 was heated to 800° C., that the reactive gas 21 was a gas mixture of disilane ($Si_2H_6$) as a material gas and hydrogen as a carrier gas which were supplied at flow rates of 100 and 300 cc/min, respectively, that the reaction chamber 6 was held at a pressure of 10 Torr, that the light 43 from the light source 42 was laser light of a 193 nm wavelength from excimer laser using Arf, and that the reactive gas 21 was irradiated by the flat light 41 for about eight minutes. The silicon film thus formed had a high resistivity of 2500 Ωcm.

EXAMPLE 3

A silicon film was deposited about 1200 A thick on the substrate surface 2 through the method which was identical with that used in Example 2 except that the disilane as the material gas forming the gas mixture introduced as the reactive gas into the reaction chamber 6 was replaced with monosilane ($SiH_4$). The silicon film thus formed had a resistivity of 2200

EXAMPLE 4

A GaAs film was deposited on the substrate surface 2 through a method which was identical with the employed in Example 1 except that the substrate 1 was heated to 500° C. and that the reactive gas 21 was a gas mixture of trimethyl gallium ($Ga(CH_3)_3$) as a material gas, arsine ($AsH_3$) as another material gas and hydrogen as a carrier gas which were supplied at flow rates of 10, 15, and 200 cc/min.

Next, a description will be given, with reference to FIG. 2, of another example of the thin film depositing method through utilization of another example of the film forming apparatus according to the present invention.

Figure 2:
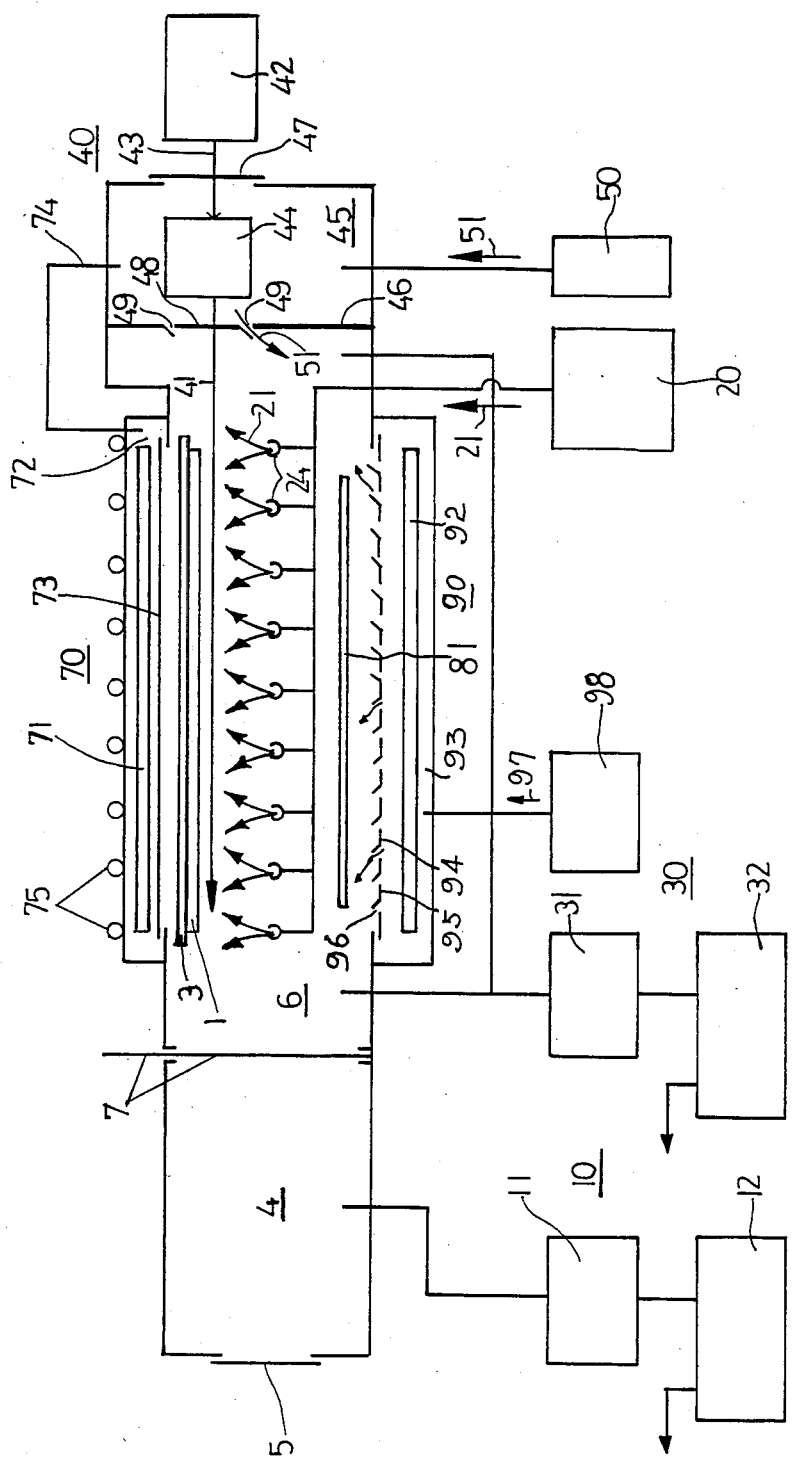
FIG. 2 is a diagram schematically illustrating another example of the film forming method by using the another example of the film forming apparatus.

The film forming method of the present invention, shown in FIG. 2, is identical with that described above in connection with FIG. 1, except that the reactive gas 21 introduced into the reaction chamber 6 is excited by irradiation not only with the that light 41 from the light irradiating means 40 but also with a scattered light 91 from another light irradiating means 90 which is directed to the substrate surface 1 perpendicularly thereto. The light irradiating means 90 has a light source 92 using a mercury lamp, for example. The light source 92 is placed in a light irradiation chamber 93 which is coupled to the underside of the reaction chamber 6 through a partition means 94. The partition means 94 has a light-transparent window 95 which permits the passage therethrough of the light from the light source 92 into the reaction chamber 6 and a plurality of slits 96 which are made in the light-transparent window 95 and through which the reaction chamber 6 and the light irradiation chamber 93 intercommunicate. The light irradiation chamber 93 is supplied with an unreactive gas 97 from another unreactive gas supply source 98 and is evacuated by the evacuating means 30 via the slits 96 and the reaction chamber 6; so the unreactive gas 97 introduced into the light irradiation chamber 93 flows in contact with or along the surface of the light-transparent window 95 on the side of the reaction chamber 6.

The light 91 from the light irradiating means 90 is obtained as scattered light which is directed perpendicularly to the substrate surface 2. The reactive gas 21 is excited by the scattered light 91 in a region between the substrate surface 2 and the partition means 94.

Since the reactive gas 21 is efficiently excited by the aforementioned flat light 41 and is further excited by the scattered light 91 directed perpendicularly to the substrate surface 2, even if the substrate surface 2 is uneven, the film 60 can be deposited all over it. The light irradiating means 90 for irradiating the reactive gas 21 by the scattered light 91 is disposed in the light irradiation chamber 93 linked with the reaction chamber 6 through the partition means 94 and the partition means 94 has the slits 96 through which the reaction chamber 6 and the light irradiation chamber 93 intercommunicate. In this case, however, since the unreactive gas 97 directed from the light irradiating means 90 toward the reaction chamber 6 flows through the slits 96, the light irradiating means 90 will not substantially be contaminated by the excited reactive gas. Moreover, since the unreactive gas 97 flowing from the light irradiation chamber 93 toward the reaction chamber 66 through the slits 96 flows in contact with or along the light-transparent window 95 of the partition means 94 in the reaction chamber 6, the window 95 will also be substantially free from contamination by the reactive gas. On this account, excitation of the reactive gas 21 by the scattered light 91 can efficiently be continued.

Next, a description will be made of specific examples of the thin film forming method employing the apparatus of the present invention.

EXAMPLE 5

A silicon film was deposited on the substrate surface 2 through a method which was the same as that used in Example 1, except that a low-pressure mercury lamp was used as the light source 92 of the light irradiating means 90, that the reactive gas 21 was excited by the scattered light 91 of a 184 nm wavelength from the light source 92 as well as by the flat light 41 described above in conjunction with Example 1, and that hydrogen was introduced into the light irradiation chamber 93 from the unreactive gas supply source 98 at a flow rate of 200 cc/min.

In this example, the substrate surface 2, though uneven, was deposited over the entire area with a silicon film of the same resistivity and thickness as in Example 1. In this instance, however, the silicon film in the concavities was slightly thinner than on the convexities of the substrate surface 2.

EXAMPLE 6

A silicon film was formed on the substrate surface 2 through a method which was the same as that employed in Example 2, except that the reactive gas 21 was excited, for seven minutes, by the flat light 41 mentioned above with respect to Example 2 and the scattered light 91 referred to above in respect of Example 5. The silicon film, which had the same resistivity as in Example 2, was deposited similarly as in Example 5, although the substrate surface 2 was uneven.

EXAMPLE 7

A silicon film was deposited on the substrate surface 2 through a method which was identical with that employed in Example 6, except that a wafer having a silicon oxide surface to be deposited with the film was used as the substrate 1 and that the substrate 1 was heated to 250° C. In this example, although the substrate surface 2 was uneven, the silicon film obtained was formed 5000 Å thick as an amorphous or microcrystalline layer which exhibited an electrical conductivity of $3 \times 10^{-4}$ $\Omega cm^{-1}$ under AM-1 condition radiation and had a dark electrical conductivity of $7 \times 10^{-11}$ $\Omega cm^{-1}$.

EXAMPLE 8

A film was deposited on the substrate surface 2 through a method which was the same as that employed in Example 7, except that the reactive gas 21 was a gas mixture of Example 7 added with ammonia gas and was excited for 10 minutes.

The film thus obtained was formed 1000 Å thick as a silicon nitride layer although the substrate surface 2 was uneven.

EXAMPLE 9

A film was deposited on the substrate surface 2 through a method which was the same as that employed in Example 8, except that the ammonia gas used in Example was substituted with $N_2O$ gas.

The film in this example was formed 3000 Å thick as a silicon oxide layer although the substrate surface 2 was uneven.

EXAMPLE 10

A GaAs film was deposited on the substrate surface 2 through a method which was the same as that employed in Example 3, except that the substrate 1 was heated to 650 C and that the reactive gas 21 was excited by the flat light 41 and the scattered light 91 as in Example 5.

The above examples should be construed as being merely illustrative of the present invention, and various modifications and variations may be effected without departing from the scope of the novel concepts of the present invention.

What is claimed is:

1. A CVD method in which a substrate having a surface to be deposited with a film is placed in a reaction chamber and a reactive gas introduced into the reaction chamber is excited by irradiation with flat light and scattered light to thereby deposit the film on the substrate surface, wherein the flat light is directed along the substrate surface in close proximity thereto, and wherein the scattered light is directed to the substrate surface perpendicularly thereto.

2. A CVD method according to claim 1 wherein the flat light is laser light having a wavelength at which it resonates with the reactive gas.

3. A CVD method according to claim 1 wherein the flat light is directed along the substrate surface at a distance 10 times or less the mean free path of the excited reactive gas.

4. A CVD method according to claim 1 wherein the film is deposited on the substrate surface held downward.

5. A CVD method according to claim 4 wherein the film is deposited on the substrate surface in a state in which the substrate is being heated from the side opposite from its surface being deposited with the film.

6. Apparatus for forming a film, comprising;
a reaction chamber in which a substrate having a surface to be deposited with a film is placed by a substrate holding means;
a means for introducing a reactive gas into the reaction chamber;
a means for evacuating the reaction chamber;
a first light irradiating means for exciting the reacive gas by irradiation with flat light;
wherein the first light irradiating means comprising a first light source, an optical means for forming the light from the first light source into the flat light, a first light irradiation chamber which is linked with the reaction chamber through a first partition means having first slits communicating with the reaction chamber and a first light-transparent window, and a means for introducing a first unreactive gas into the first light irradiation chamber;
wherein the optical means is disposed in the first light irradiation chamber so that it directs the flat light along the substrate surface in close proximity thereto through the first light-transparent window of the first portition means.

7. Apparatus according to claim 6 wherein the first light source emits laser light of a wavelength at which it resonates with the reactive gas.

8. Apparatus according to claim 6 wherein the optical means of the first light irradiating means directs the flat light along the substrate surface at a distance 10 times or less the means free path of the excited reactive gas.

9. Apparatus according to claim 6 wherein the substrate holding means holds the substrate downward.

10. Apparatus according to claim 9 further comprising a means for heating the substrate from the side opposite from its surface to be deposited with the film.

11. Apparatus according to claim 6 further comprising:
- a second light irradiating means for exciting the reactive gas by irradiation with scattered light;
- wherein the second light irradiating means comprising a second light source, a second light irradiation chamber which is linked with the reaction chamber through a second partition means having a second slits communicating with the reaction chamber and a second light-transparent window, and a means for introducing the first unreactive gas or a second unreactive gas into the second light irradiation chamber;
- wherein the second light source is disposed in the second light irradiation chamber so that it directs the scattered light to the substrate surface perpendicularly thereto through the second light-transparent window of the second partition means.

* * * * *